United States Patent [19]
Billion

[11] 3,936,705
[45] Feb. 3, 1976

[54] MONITOR CIRCUIT

[76] Inventor: Leo Jozef Maria Billion, 19, Rijkestraat, 3009-Winksele, Belgium

[22] Filed: Aug. 20, 1974

[21] Appl. No.: 499,006

Related U.S. Application Data

[62] Division of Ser. No. 357,921, May 7, 1973, now Pat. No. 3,845,363.

[52] U.S. Cl. .......................... 317/136; 317/148.5 B
[51] Int. Cl.² ...................................... H01H 47/32
[58] Field of Search ...................... 317/136, 148.5 B

[56] References Cited
UNITED STATES PATENTS 3,296,499   1/1967   Quinlan .............................. 317/136
3,597,737   8/1971   Wallace, Jr. et al. ................ 317/136

Primary Examiner—J. D. Miller
Assistant Examiner—Harry E. Moose, Jr.
Attorney, Agent, or Firm—Wilkinson, Mawhinney & Theibault

[57] ABSTRACT

A monitor circuit for indicating the change of state of one of a plurality of signalizing switching elements, each switching element controlling according to its state the state of an electronic switch, said electronic switches controlling indicating means.

4 Claims, 2 Drawing Figures

MONITOR CIRCUIT

This is a division of application Ser. No. 357,921, filed May 7, 1973, now Pat. No. 3,845,363.

DISCUSSION OF THE PRIOR ART

My invention relates to monitor circuitry and more particularly to circuitry for monitoring a number of points with a system being supervised and to provide an indication of the first of those points to depart from normality.

In a process supervisory and monitoring system an unlimited number of alarm points may be provided such as non recycle limit switches in a process for example. In the operation of such systems it is frequently desired to know which alarm point first departed from normality to provide an alarm signal. It is an object of my invention to provide an improved monitoring apparatus that is relatively simple in circuit arrangement, economical in first cost and maintenance, reliable and compact in size, and one which is particularly versatile to use with a variety of output signals employed in the monitoring of relatively complex systems.

SUMMARY OF THE INVENTION

In accordance with my invention there is provided a monitor circuit for indicating the change of state of one of a plurality of signalizing switching elements each being associated with indicating means wherein the signalizing switching elements are connected into a series- or parallel circuit, the input of which being connected with one terminal of a source of a control voltage for a plurality of electronic switches, each being capable to switch from a non-conducting to a conducting state following the supply of a control voltage thereto, each signalizing switching element having one terminal connected with the trigger electrode of such an electronic switch, controlling indicating means through its load circuit, the electronic switches being connected in parallel to a second source, through a circuit with an electric element responsive to current flow therethrough caused by the switching into the conducting state of one of the electronic switches, and influencing the trigger circuits of the other corresponding electronic switches such that they can no longer switch over into a corresponding state, the second terminal of the control voltage source being connected with a common return line of the control circuits of the respective elements.

The electronic switches are preferably thyristors. Preferably each signalizing switching element controls preferably at least two electronic switches the indicating means being connected in the load circuit of the first while the conducting state of the second electronic switch, whose control circuit is connected with the electric element that is responsive to a current flow therethrough caused by switching into the conducting state of the second electronic switch, modifies the information furnished by the first electronic switch.

Preferably a transistor is connected in the circuit of the first electronic switch comprising a transistor, its base being connected with a biasing current source, an AC source and the anode of the second electronic switch: such that when the second electronic switch is in the non-conducting state the bias current keeps the transistor conducting while, when the second electronic switch conducts, the biascurrent is modified such that the A.C. source periodically brings the transistor in the conducting- and non-conducting state. This has the advantage that the first alarm is indicated by indicating means, e.g. lamps, which are active intermittatingly, while each following alarm is indicated by indicating means which are active continuously.

In a particular embodiment in order to guarantee a reliable electrical contact, two currents flow simultaneously across the alarm contact. A first current results from a low voltage applied on the control circuit. This voltage can be a part of the supply voltage, a second current results from a much higher voltage applied across the alarm contact, via a diode and a current limiting resistor and has no other influence on the alarm circuitry than putting a sufficiently high voltage across the alarm contact in order to guarantee a good electrical contact. The source for this current can be a more important part of the supply voltage.

This unique feature guarantees a reliable contact under industrial operating circumstances, and solves the problem of how to use low voltages for triggering solid state switches without affecting the low input impedance characteristics of the control circuit used therefor.

DESCRIPTION OF PREFERRED EMBODIMENTS

Figure 1:
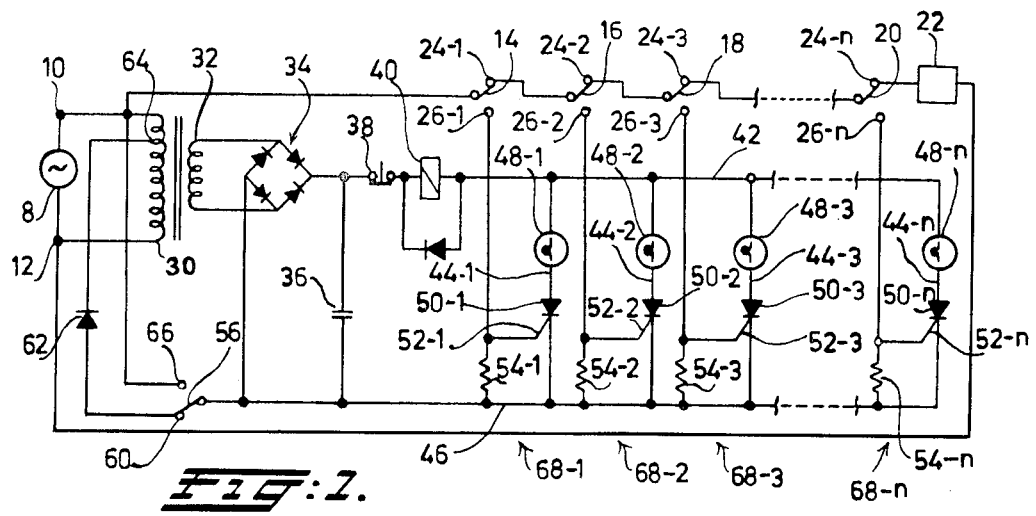
FIG. 1 is a schematic diagram of a monitor or indicator system in accordance with the invention.

With reference to FIG. 1, a 220 Volt A.C. signal from a first electrical source 8 is applied between terminals 10 and 12. Connected to terminal 10 is a series of switches, 14–20, which control the supply of power from terminal 10 to a process control system 22. The system 22 controls the supply voltage to the process system and shuts down a part or the entire process in case of failure or other malfunction.

Each switch has a normally closed contact 24 and a normally open contact 26. The contact 26 closes when a malfunction occurs at the point which is supervised by said switch, e.g. overheating.

Also connected to terminals 10 and 12 is the primary winding 30 of the transformer whose secundary winding 32 provides a 24 Volt output and to which is connected full wave rectifier 34 which has capacitor 36 connected across it. The DC. output of the second electrical source is applied through reset switch 38 and relay coil 40 to bus 42.

A series of indicator circuitrs 68a, 68b – 68n each of which corresponds to a limit switch, are connected between bus 42 and bus 46. Each indicator circuit 68 includes a lamp 48 and a controlled rectifier 50 (SCR).

The control electrode 52 of each controlled rectifier is connected to a control circuit that includes a resistor 54 connected to bus 46 and a connection to the normally open contact 26 of the corresponding switch. Bus 46 is connected via the switch 56 which is controlled by the reed relay coil 40 to either normally closed terminal 60 which in turn is connected via the diode 62 to the top 64 at which point there is a voltage difference of five volts with the terminal 10, or, via normally open terminal 66, directly to terminal 10.

In operation, the switches 14–20 are normally in the position shown in FIG. 1, so that the controlled and supervised system 22 can be operative. Should any of the switches operate e.g. as a result of too high a temperature and thus complete a circuit to the normally open terminal 26, a signal is applied from the A.C. source 8 through the control circuit to the control electrode 52 of the corresponding indicator circuit 44 to bring the controlled rectifier switch 50 into the conducting state, thus completing a circuit from the D.C. source 34 through the relay coil 40 and the associated indicator lamp 48 to bus 46.

Thus the lamp 48 corresponding to the operated switch lights up, indicating that this particular switch has been operated.

When current flows in an indicator circuit, it flows through the relay coil 40 which moves switch member 56 from terminal 60 to terminal 66 thus eliminating the voltage differential across resistors 54 and preventing the triggering of a second controlled rectifier 50.

The energized indicator lamp 48, however, will remain energized even though the switch which indicated its energization may return to its normal position or a second limit switch is actuated. The energized indicator lamp 48 thus provides an indication of the first limit switch to be actuated, which indication is maintained until the reset switch 38 is operated. Operation of that reset switch de-energizes relay coil 40, permitting switch member 56 to return to its normal position, and releasing the operated controlled rectifier 50.

Figure 2:
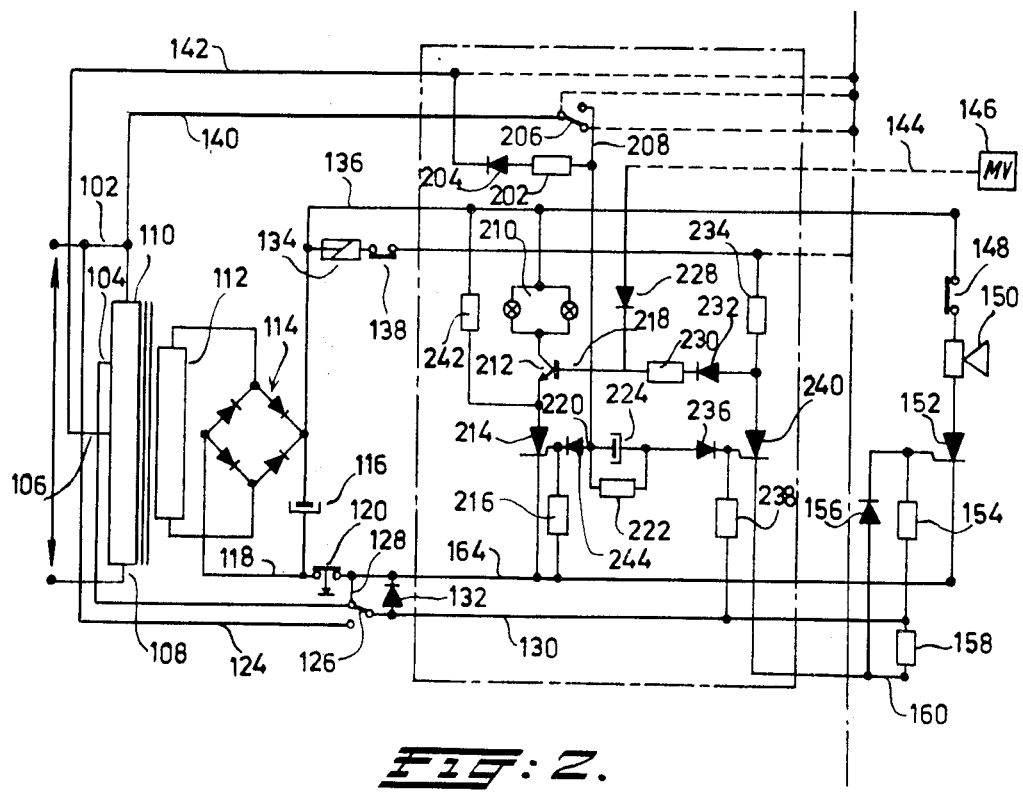
FIG. 2 is a schematic diagram of a second monitor or indicator system in accordance with the invention.

Another monitor system is shown in FIG. 2. Here the switches 206 are not connected in series, but in parallel. The circuit of one alarm point only is shown. The part of the circuit between dotted lines can be repeated for any number of alarm points.

An A.C. signal is applied across terminals 102 and 108 to the transformer primary winding 110 whose secondary winding 112 is connected to a fullwave rectifier bridge 114 which has the capacitor 116 connected across it.

The output of the DC source is applied to the bus 136 and through the reed relay 134 and the first out reset switch 138 to bus 246. A series of indicator circuits, each corresponding to a switch such as the switch 206 are connected between the bus 136 and the return bus 164. Return bus 164 is connected to the tap 104 which provides 5 volts with respect to terminal 102.

Each indicator circuit includes the series circuit of two indicator lamps 210, a transistor 212 and a controlled rectifier 214. A resistor 242 is connected across the series circuit of the indicator lamps 210 and the transistor 212.

A second controlled rectifier 240 is also connected to the circuit and its control electrode 250 is connected to a series circuit with a coupling capacitor 224 in parallel with the resistor 222, the diode 236, the resistor 238 to bus 130 and via the normally closed contact 126 to tap 104. The indicator circuit also includes a control or input circuit connected to the normally open terminal 208 of the corresponding switch and connected through the diode 244 to the control electrode 252 of the controlled rectifier 214, and goes through the resistor 216 to the bus 164 and to the tap 104 on the transformer 110.

Each of the controlled rectifiers 240 is connected between a common reed relay 134 in series with the first-out reset button 138 and a common cathode resistor 158 to the bus 130. In series with each second controlled rectifier is a resistor 234, the voltage drop over which, caused by the conducting of said controlled rectifier, suppresses the continuous positive voltage which was present on the base 218 of transistor 212 (and which caused said transistor to be conducting) which will now be controlled by the square wave voltage from multi-vibrator 146, resulting in a periodic switching off of the transistor 212, causing the corresponding lamps 210 to flicker.

In operation the switches 206 are normally in the position shown in FIG. 2. Should any switch operate to complete a circuit to its normally open contact 208, a signal is applied to control electrode 252 via diode 244 to cause the first controlled rectifier 214 to conduct, thus completing a circuit from the DC source 114 through the lamps 210 and the transistor 212 and the controlled rectifier 214 to the bus 164, reset switch 120 and DC supply 118. The voltage applied to control electrode 252 is also coupled as a pulse through the capacitor 224 to the second controlled rectifier 240 which will conduct and completes a circuit from bus 136 through reed relay 134, first-out reset push button, bus 246, resistor 226, thyristor 240 to the resistor 158 common for all the second controlled rectifier, diode 132, reset button 120 and DC supply 118.

As indicated above the voltage drop across the resistor 234 is sufficiently high to block the base current via diode 232 and resistor 230 so that now the multivibrator 146 controls the transistor 212 and the current through the indicator lamps 210, which is periodically blocked when the transistor 212 is non conducting, so that the lamps flicker.

Resistor 242 insures a minimum current through the conducting switch 214. On a first switching of a controlled rectifier 240 the positive voltage across the common cathode resistor 158 will trigger a controlled rectifier 152 so that an alarm horn 150 will sound. The alarm horn 150 can be reset by temporarily opening its supply circuit by means of the push button 148 which can be combined with the push button 138.

A total reset of the circuit can be achieved by means of the push button 120. If, on operation of push button 120, all the switches 206 are open, the circuit will be reset upon release of push button 120. However, if some alarms are still on, the indicator circuit that was flashing will now be lighted continuously as the capacitor 224 will be charged and prevent the switching-on of the second controlled rectifier 240 in that circuit.

Should another switch 206 subsequently close, such closing will cause its corresponding lamps 210 to be energized, but they will flash on and off, and the alarm horn 150 will sound again.

In order to guarantee a reliable contact on the closing of the switch 206 another current besides the normal control current for switching on the controlled rectifier 214 and 240, using a control voltage taken between the tap 102 and the tap 104 of the transformer 110 being only a part of the line supply voltage, which other current results from a greater part of the line supply voltage taken from the taps 102 and 106 of the transormer 110 is sent through the alarm contact 206 via a current limiting resistor 202 and a diode 204.

While particular embodiments have been shown and described, various modifications thereof will be apparent to those skilled in the art and therefore it is not intended that the invention be limited to the disclosed embodiments or to details thereof and departures may be made therefrom within the spirit and scope of the invention as defined in the claims.

What I claim is:

1. Monitoring system comprising a number of signalizing circuits each comprising a first electronic switch, such as a thyristor, having a control electrode and associated with a signalling device which is to be activated by current flowing through it, all first thyristors being connected into parallel between two common lines of which the first one is connected to the first terminal of a direct current source and of which the second one is connected through a normally closed reset switch to the second terminal of this current source, a source of control voltage being provided for switching any one of the first thyristors from the non-conducting into the conducting state in response to the application of this voltage to its control electrode, said source being connected to the inputs of alarm switching elements each one of which, being coupled to the control electrode the first thyristor of a signalizing circuit and through a capacitor to the control electrode of a second thyristor of this signalizing circuit, the respective second thyristors of the signalizing circuits being connected to a common parallel circuit, which second thyristor controls the state of conductivity of a transistor or the like element associated with the first thyristor and with the signalling device and of which the conductivity is also controlled by the output signal of a source of alternating voltage.

2. Circuitry as defined in claim 1, wherein the base of the transistor is connected through a diode with a square wave generator, through a diode and a resistor in series with a bias voltage source, and with the anode of the respective second electronic switch.

3. Circuitry as defined in claim 1, wherein a common resistor has been connected in series with the parallel circuit of the second electronic switches, said common resistor being coupled to control a common thyristor for controlling an audible alarm circuit.

4. Circuitry as defined in claim 1 wherein the output of each signalizing switching element is also connected through a current limiting resistor and a diode to one terminal of a source having a higher potential than the input of the control voltage source.

* * * * *